United States Patent [19]

Vali

[11] 4,195,265
[45] Mar. 25, 1980

[54] VARIABLE RESPONSE NOTCH FILTER FOR MACHINE RESONANCE ELIMINATION IN A SERVO CONTROL SYSTEM

[75] Inventor: Enn Vali, Burlington, Canada

[73] Assignee: Westinghouse Canada Limited, Hamilton, Canada

[21] Appl. No.: 913,526

[22] Filed: Jun. 8, 1978

[30] Foreign Application Priority Data

Nov. 7, 1977 [CA] Canada ................................. 282504

[51] Int. Cl.² ............................................. H03B 1/04
[52] U.S. Cl. ................................... 328/167; 330/109; 333/171
[58] Field of Search .................... 328/165, 167, 155; 330/107, 109, 294; 333/170, 171

[56] References Cited

U.S. PATENT DOCUMENTS

| | | | |
|---|---|---|---|
| 3,355,668 | 11/1967 | Boensel et al. | 328/167 |
| 3,369,189 | 2/1968 | Hoffman et al. | 330/109 |
| 3,577,179 | 5/1971 | West | 330/107 |
| 3,628,057 | 12/1971 | Mueller | 328/167 X |
| 3,673,503 | 6/1972 | Parker | 328/167 |
| 4,120,370 | 10/1978 | Bosson et al. | 328/167 X |

*Primary Examiner*—John S. Heyman
*Attorney, Agent, or Firm*—Robert H. Fox; Edward H. Oldham

[57] ABSTRACT

This invention relates to a flexible notch filter for use in a servo system to eliminate natural mechanical resonance. The filter is an improved "twin-T" type where the "in-phase" output of the filter is fed back into the filter. Varying the feedback varies the bandwidth of the filter. The improved filter further provides for attenuation control in addition to control of the center frequency of the filter. The advantage of this filter over prior art designs is that one filter may be manufactured and adapted to be used in many servo systems since the filter can be easily adjusted to effectively eliminate the natural resonating frequency of the machine in addition to reducing phase lag at frequencies below the center frequency of the notch filter.

3 Claims, 4 Drawing Figures

VARIABLE RESPONSE NOTCH FILTER FOR MACHINE RESONANCE ELIMINATION IN A SERVO CONTROL SYSTEM

BACKGROUND OF THE INVENTION

In the past, servo control systems have been forced into unstable oscillations when the mechanical device driven by the system has been subjected to some form of shock, for example, a rapid reversal of drive direction. This shock induces vibrations in the mechanical device at a frequency peculiar to that device. The frequency of the vibrations may be termed the natural resonating frequency of the device. The resonating frequency may be induced into the electronics of the servo system thereby producing a control signal with a frequency component corresponding to that of the natural resonating frequency. The introduction of the natural resonating frequency into the control signal may be considered as positive feedback which may result in the mechanical device vibrating uncontrollably.

One approach to eliminate the adverse effects of the resonant frequency has been to incorporate a twin-T or parallel-T notch filter with the notch frequency adjusted to the resonant frequency of the mechanical device. This method is outlined in Canadian Pat. No. 822,306 issued Sept. 2, 1969 and assigned to Westinghouse Canada Limited. The aforementioned Canadian Patent disclosed a circuit comprised of two "T" configurations. The trunk section of the first "T" is formed by a resistor extending from a ground connection to a connection between a pair of capacitors on either side of the trunk and the capacitors form the horizontal segment of the "T". The trunk section of the second "T" is formed by a capacitor connected from the ground connection to a point between a pair of resistors on either side of the trunk and the resistors form the horizontal segment of the second "T". The end terminals of the pair of resistors are further connected in parallel with the end terminals of the pair of capacitors. While the circuit described in the aforementioned Canadian Patent results in stable operation of the servo system, it has the disadvantage that once the capacitors and resistors are fixed, the centre frequency, the bandwidth, and the attenuation factor of the notch filter can not be varied to minimize the phase delay of the system. The delay in the response of the system may result in large amounts of overshoot being present in the motion response of the mechanical device due to a change of the control signal.

SUMMARY OF THE INVENTION

This invention relates to the application of a novel notch filter to reduce a frequency component of a control signal where the control signal operates a mechanical device in a servo system and the frequency component reduced corresponds to the natural resonating frequency of the mechanical device. The control signal is usually a D.C. signal but in some cases it may be an A.C. singal both of which may be varied in magnitude. The motion of the mechanical device may correspond directly or inversely proportional to the magnitude of the control signal. Abrupt changes in the magnitude of the control signal may result in abrupt changes in the device's motion. The abrupt change in the motion of the device or the vibration of the device during normal operation may induce a frequency component corresponding to the natural resonating frequency of the device in the control signal which when applied to the device will cause the device to oscillate uncontrollably. Placement of the filter between the servo control system and the mechanical device provides for the elimination of a band of frequencies in the control signal corresponding to the natural frequency of the device while still permitting the D.C. component or the A.C. component of the control signal through the filter.

It should be understood that the mechanical device will not have a single value for the natural resonating frequency. The mechanical device will have a number of frequencies all in close proximity to one another and may very well constitute a band of natural resonating frequencies for the device. This band of frequencies may resemble a frequency spectrum having it's own centre frequency. Furthermore, this band of frequencies may be close to the D.C. component of the control signal so that a filter should eliminate the natural frequency band and not affect other frequencies close to that of and including the D.C. component of the machine.

In order to effectively eliminate the natural frequency band of the mechanical device the filter of the present invention feeds the "in-phase" output of the notch filter back into the filter. Regulating the feedback controls the notch width of the filter. Controlling the notch width of the filter has the advantage that once the centre frequency of the filter has been set to that of the devices' resonating frequency, the bandwidth of the filter may be narrowed to the band of natural resonating frequencies. Reducing the notch width of the filter to that of the band of natural resonating frequencies effectively reduces the resonating frequencies while at the same time greatly reducing the effects of phase delay on frequencies below the centre frequency of the notch filter. Reducing the phase delay at the frequencies below the centre frequency and close to the D.C. component of the control signal results in minimal overshoot incorporated in the response of the mechanical device when subjected to changes in magnitude of the control signal.

The notch filter of the present invention also permits the centre frequency of the filter to be adjusted as well as the attenuation factor of the filter.

The filter used in this invention is a novel modification of a basic twin-T notch filter. The modified circuit is more flexible than the conventional twin-T filter because the notch width of the filter of this invention can be varied by feeding back regulated amounts of the "in-phase" output from the conventional twin-T filter. The output is fed back to a point at the base of the trunk of each T of the twin-T filter. Regulating the feedback results in the notch width being optimized in each system so that the phase lag of frequency components of the control signal at frequencies below the notch frequency is minimized.

The basic twin-T may be modified to provide a means for adjusting the attenuation at the centre frequency of the filter as well as frequencies on either side of the notch. The ability to decrease the notch attenuation further decreases the amount of phase lag at frequencies below the notch frequency. The addition of a variable resistor placed in series with the capacitor normally found in one of the trunks of the twin-T filter provides for an easy adjustment of the attenuation factor if required.

A means for regulating the resistors of the twin-T is provided which further allows the centre frequency of the notch to be adjusted.

The advantage of this novel filter when used in a servo system is that the centre frequency of the filter can be readily adjusted. Moreover, the notch width and notch depth can be adjusted to eliminate the natural resonating frequency band of the mechanical device in the control signal in addition to decreasing phase delays which will thereby optimize the performance of the servo system.

DESCRIPTION OF THE PREFERRED EMBODIMENT

Figure 1:
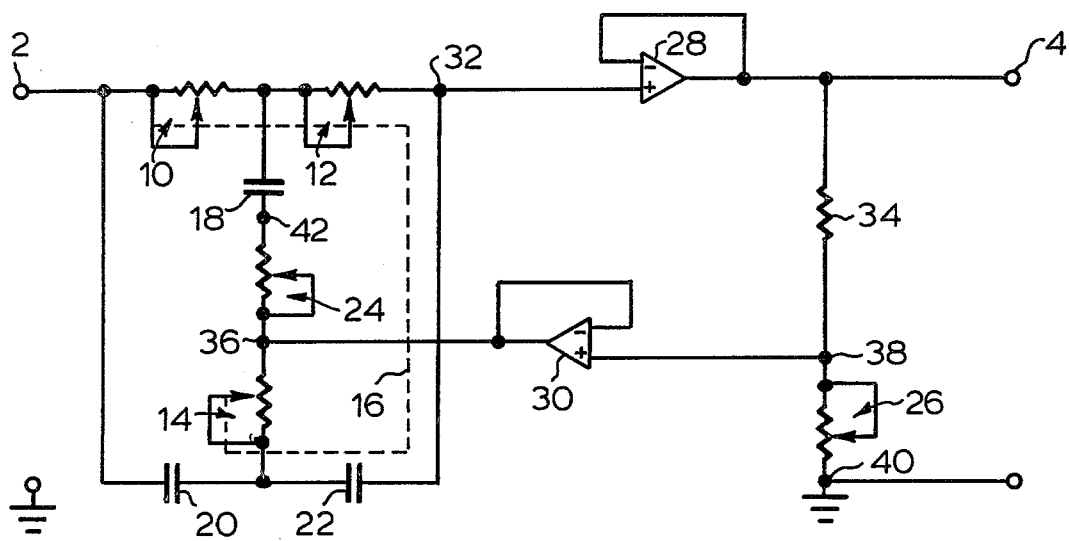
FIG. 1 shows the circuit diagram for the notch filter of the preferred embodiment.

FIG. 1 shows the notch filter of the preferred embodiment. The control signal enters the filter at input terminal 2 from the servo control system and leaves the filter via terminal 4 which may be connected to the input of the drive motor of the mechanical device. In passing through the filter any frequency components of the control signal which are substantially similar to the natural resonating frequency of the mechanical device will be eliminated.

The filter comprises three variable resistors 10, 12 and 14. Broken line 16 is indicative of a single controller which controls the resistance of variable resistors 10, 12 and 14 in unison. Capacitors 18, 20 and 22 along with variable resistors 10, 12 and 14, when viewed without further consideration of the remaining elements of the filter circuit exemplify the basic twin-T notch filter with only one exception. The exception is that variable resistors 10, 12 and 14 would be replaced by fixed resistors which would eliminate the need for controller 16. It should therefore be evident that one of the novel features of the notch filter is that variable resistors 10, 12 and 14 may be varied in unison to change the center frequency of the notch filter.

It should be understood that the centre frequency of the twin-T notch filter, $f_c$, may be given by the formula:

$$f_c = 1/2\pi RC;$$

where R is the resistance value of variable resistor 12 and C corresponds to the capacitance value of capacitor 20 and that the following conditions are present:
(1) the resistance of variable resistor 10 is equal to the resistance of variable resistor 12 which in turn is equal to twice the resistance of variable resistor 14; and
(2) the capacitance of capacitor 20 is equal to the capacitance of capacitor 22 which in turn is equals to one half the capacitance of capacitor 18.

Variable resistors 24 and 26 vary the attenuation of the notch and the notch width, respectively. Unity gain amplifiers 28 and 30 act as buffers and provide for "inphase" feedback from point 32 through amplifier 28, feedback resistor 34, and amplifier 30 to point 36. It should be understood that independent controls for variable resistors 24 and 26 may be provided. The amount of the output signal that is fed back is given by the formula:

$$F = R_V/R_V + R_F;$$

where $R_V$ is the resistance value of variable resistor 26 and $R_F$ is the resistance of feedback resistor 34.

A unity feedback value, in theory, makes the bandwidth of the filter infinitely narrow. Resistor 34 is incorporated in the circuit to insure a feedback less than unity so that the bandwidth may not be adjusted narrower than the band of natural resonating frequencies. If the notch width of the filter becomes narrower than that of the natural resonating frequency, the filter becomes too sensitive and the servo system may be easily sent into unstable oscillations.

To illustrate the flexibility of applying this novel filter arrangement, one possible method of adjusting the filter to effectively eliminate the natural frequencies of the mechanical device as well as to minimize the phase lead and phase lag effects will be described below.

Figure 2:
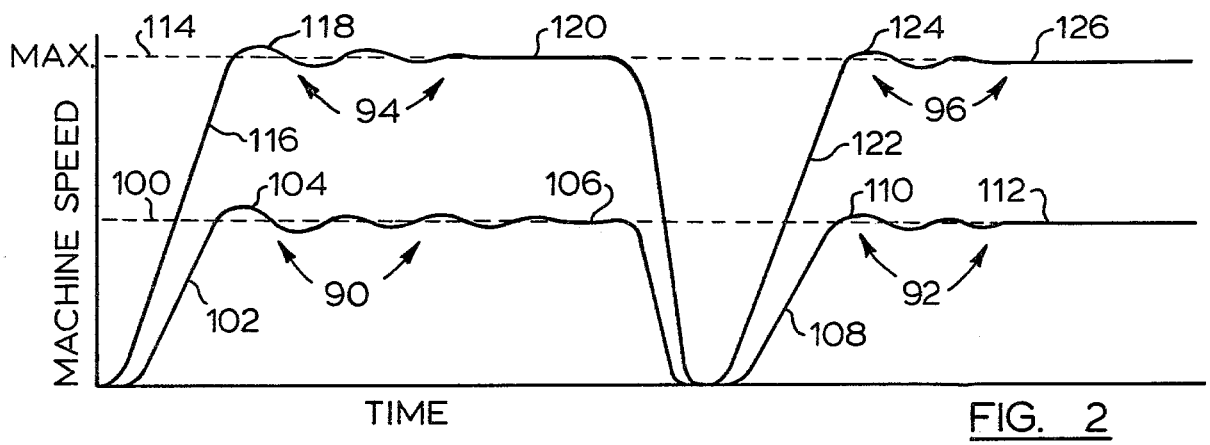
FIG. 2 shows a series of curves of Speed vs. Time for the mechanical device.

To aid with the description for tuning the filter, the four curves 90, 92, 94, and 96 of FIG. 1 will be described. FIG. 2 is a plot of machine speed vs time. It should be understood that the machine speed may correspond to a shaft rotation speed or a linear speed.

The first step could be to adjust variable resistor 26 maximum clockwise to cause the filter to have the narrowest width. Next variable resistor 24 may be set to the mid-range. When variable resistors 24 and 26 are set in this fashion, controller 16 may operate variable resistors 10, 12 and 14 to set the centre frequency.

If the machine speed vs time is displayed on a oscilliscope, the curve 90 of FIG. 2 would first be seen when the speed of the machine is increased to some finite value 100. The speed would rise with slope 102 and ringing 104 would occur due to the machine natural resonance. The number of cycles of ringing in a second would be indicative of the natural resonating frequency of the machine. At this time, controller 16 of FIG. 1 would be adjusted until the curve levelled off to point 106. Stopping the machine and bringing it up to speed 100 again might give a curve similar to curve 92 where slope 108 is the same as slope 102 of curve 90. The ringing 110 would be considerably less than ringing 104 with the speed levelling out sooner to line 112. By adjusting controller 16 (FIG. 1) to minimize ringing 104 in curve 90 to look more like ringing 110 in curve 92, the centre frequency of the filter would be set substantially equal to that of the natural resonant frequency of the machine. The ringing 110 still evident in curve 92 is due more to the notch width being too narrow and causing sensitivity problems.

The next step would be to adjust the notch width of the filter. This can be done by bringing the speed of the machine up to maximum speed 114 (FIG. 2). As the speed rises with slope 116, overshoot 118 is present to a greater extent in curve 94 than in curve 92 because of the more abrupt change in bringing the machine up to speed. The width of the notch is adjusted by controlling variable resistor 26 (FIG. 1). The notch width is adjusted until at some time curve 94 levels off to line 120. The machine is stopped and brought up to maximum speed 114 again. This may give rise to a curve similar to that of curve 96 where the overshoot 124 is minimized, line 126 has levelled out quickly and slope 122 is equal to slope 116.

It should be understood that in obtaining curves 92 and 96 from curves 90 and 94, respectively, the machine may have had to have been started and brought up to desired speed several times.

The next step might be to adjust variable resistor 24 to set the attenuation factor to minimize overshoot 124 in curve 96. It should be noted that varying variable resistor 24 results in the centre frequency of the filter shifting, but the shift in frequency is usually so small it is of no major significance.

Figure 3A:
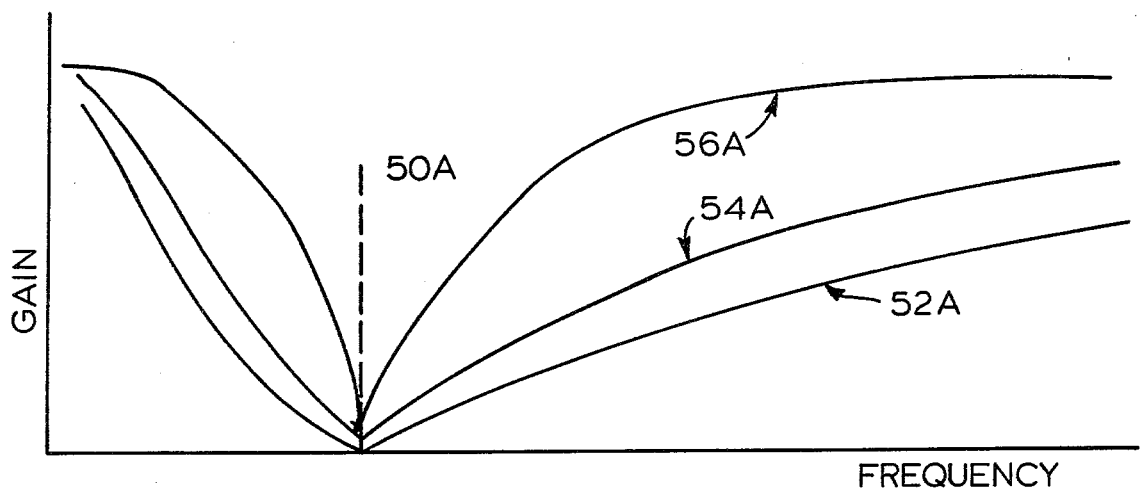
FIG. 3A shows three curves for a plot of Gain vs. Frequency for the notch filter of FIG. 1 where the feedback has been adjusted.
Figure 3B:
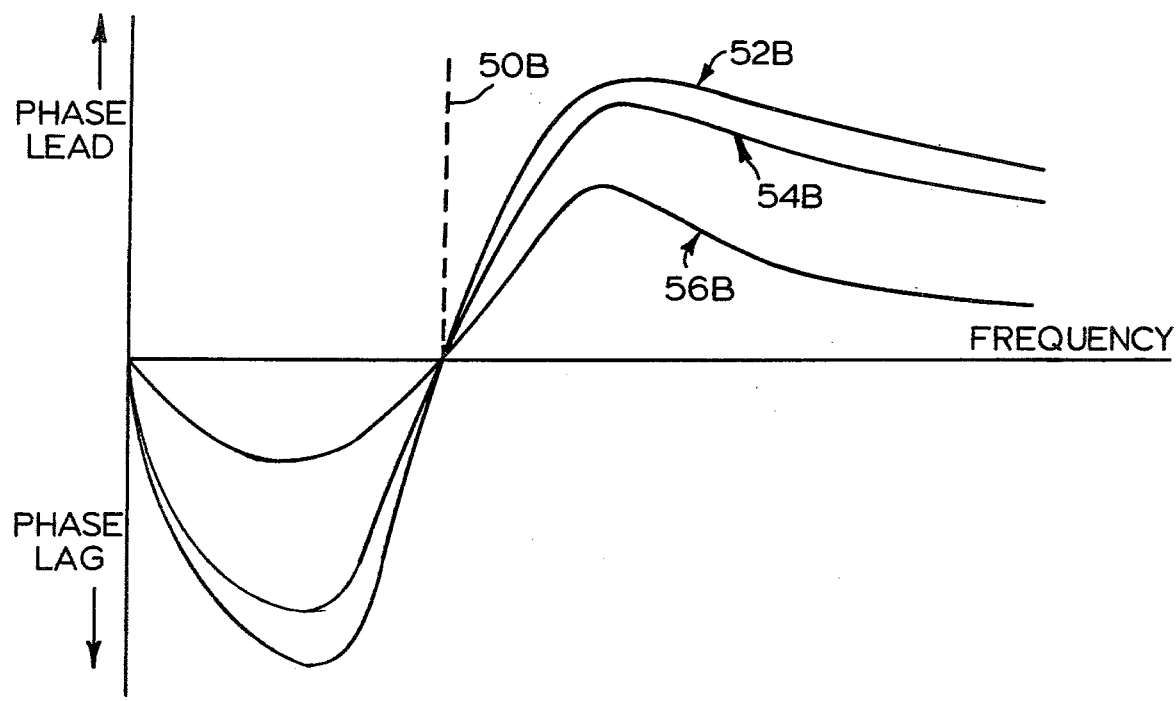
FIG. 3B shows a plot of three curves of Phase Response vs Frequency where the changes in phase response correspond to the changes in bandwidth of the curves of FIG. 3A.

Referring now to FIGS. 3A and 3B the effects of varying the notch width on the phase response are shown for the filter of FIG. 1. Lines 50A and 50B correspond to the centre frequency setting of the filter where frequency 50A is equal to frequency 50B.

Curves 52A and 52B correspond to variable resistor 26 being set so that point 38 is shorted to ground point 40 (FIG. 1) which will result in no feedback. The notch width of curve 52A is wider than the other "A" curves and the phase lead and lag of curve 52B is greater than the phase lead and lag of the other "B" curves over all frequencies except the centre frequency. It should be apparent that eliminating the presence of a feedback signal gives the poorest phase curve 52B which causes the worst phase delay and overshoot problems of the "B" curves.

Curves 54A and 54B are indicative of variable resistor 26 of FIG. 1 being set at the mid-range. As is evident, the notch width of curve 54A is narrower than that of curve 52A and the phase lag and lead of curve 54B is less than that of curve 52B except at the centre frequency 50B.

Curves 56A and 56B are indicative of variable resistor 26 of FIG. 1 being set to give three-fourths its maximum resistance. As is evident, the notch width of curve 56A is narrower than any other curve resulting in the phase lag and lead of curve 52B being less than any of the "B" curves.

It should be clear that as the notch width decreases delays in the phase response decrease which will result in a decrease in overshoot. It should further be noted that making the notch too narrow may not effectively eliminate all the natural resonating frequencies of the machine.

In most cases, the natural resonating frequency of a mechanical device is in the order of a few hertz. In order to eliminate this low frequency, capacitors 20 and 22 may be chosen in the order of one half a micro-farad. Variable resistors 10 and 12 may be in the order of 100 kilo-ohms. Variable resistors 24 and 26 may be in the order of 50 kilo-ohms with resistor 34 around 20 kilo-ohms.

A novel notch filter for a servo system has been disclosed which is very flexible in adjusting the centre frequency of the notch to the natural resonating frequency of the mechanical device operated by the servo system. This novel filter application further reduces phase delays and overshoot for changes in the motion of the device.

It should be understood that even though a single twin-T notch filter has been described for a servo system, more than one notch filter may be employed to stabilize operation of a multiple drive servo system. An example of a multiple drive servo system is the x-y co-ordinate photo-electric drive system described in Canadian Pat. No. 917,773 issued Dec. 26, 1972 which is assigned to Westinghouse Canada Limited.

The embodiments of the invention in which an exclusive property or privilege is claimed are defined as follows:

1. A servo system including an improved twin-T notch filter, said system including control signals for controlling the motion of a mechanical apparatus, said apparatus having a band of natural resonating frequencies, the notch filter receiving the control signals at input terminals and permitting the passage of the control signals therethrough to output terminals operably connected to the apparatus, said notch filter substantially eliminating any component of the control signals substantially equal in frequency to said natural resonating frequencies, said notch filter comprising means for feeding back an in-phase amount of the control signal from the output terminals to the base of the twin-T filter, said means including a control means for regulating the amount of control signal fedback thereby adjusting the notch width to an effective minimum and thereby minimizing phase delay effects on the frequency components of said signal in close proximity to but less than said natural resonating frequencies.

2. The twin-T notch filter as claimed in claim 1 wherein the filter further comprises a means for adjusting the attenuation of the notch of the filter.

3. The twin-T notch filter as claimed in claim 2 wherein the filter further comprises a means for adjusting the centre frequency of the filter to correspond to the natural resonating frequencies.

* * * * *